United States Patent [19]
Naraki et al.

[11] Patent Number: 5,668,624
[45] Date of Patent: Sep. 16, 1997

[54] SCAN TYPE EXPOSURE APPARATUS

[75] Inventors: Tsuyoshi Naraki, Tokyo; Kei Nara, Yokohama, both of Japan

[73] Assignee: Nikon Corporation, Tokyo, Japan

[21] Appl. No.: 358,590

[22] Filed: Dec. 14, 1994

[30] Foreign Application Priority Data

Dec. 22, 1993 [JP] Japan ................................. 5-323717

[51] Int. Cl.⁶ ........................... H01L 21/027; G03B 27/72
[52] U.S. Cl. ......................... 355/53; 355/69; 355/70; 355/71
[58] Field of Search ........................ 355/46, 53, 71, 355/70, 67, 68, 69

[56] References Cited

U.S. PATENT DOCUMENTS

| | | | |
|---|---|---|---|
| 3,784,301 | 1/1974 | Sato | 355/46 |
| 3,799,666 | 3/1974 | Fukushima et al. | 355/46 |
| 5,305,054 | 4/1994 | Suzuki et al. | 355/53 |
| 5,359,389 | 10/1994 | Isohata | 355/53 |
| 5,473,410 | 12/1995 | Nishi | 355/53 |
| 5,581,075 | 12/1996 | Naraki et al. | 355/69 X |

Primary Examiner—Matthew S. Smith
Assistant Examiner—David A. Lane
Attorney, Agent, or Firm—Shapiro and Shapiro

[57] ABSTRACT

A scan type exposure apparatus has a mask stage for mounting a mask formed with an exposure pattern in a pattern area; a substrate stage for mounting a rectangular photosensitive substrate; a driving unit for moving the mask stage and the substrate stage in synchronism parallel to one side of the rectangular photosensitive substrate; illumination optical systems for illuminating partial areas of the mask with light beams; and projection optical systems for projecting images of the illuminated areas of the mask onto the photosensitive substrate. The projection optical system projects the light beams passing through the exposure pattern area of the illuminated mask on a central area, excluding peripheral areas, of an exposure area of the photosensitive substrate and projects the light beams passing through an area other than the exposure pattern area of the illuminated mask on the peripheral areas. The scan type exposure apparatus also has an exposure quantity control unit for setting an exposure quantity for the peripheral areas larger than an exposure quantity for the central area.

20 Claims, 4 Drawing Sheets

SCAN TYPE EXPOSURE APPARATUS

BACKGROUND OF THE INVENTION

1. Field of the Invention

The present invention relates to a scan type exposure apparatus for manufacturing a semiconductor device and a liquid crystal display panel and, more particularly, to a scan type exposure apparatus capable of performing a peripheral exposure without using a dedicated peripheral exposure apparatus.

2. Related Background Art

In recent years, a liquid crystal display panel has been often employed as a display device of a personal computer, a TV set, etc. Further, an areal size of this liquid crystal display panel has increased, to the order of 500 mm×500 mm.

This liquid crystal display panel is constructed by effecting patterning of a transparent thin-film electrode in a desired configuration on a rectangular glass substrate by photolithography. An apparatus for this photolithography involves the use of an exposure apparatus for exposing an exposure pattern formed on a mask onto a photoresist layer on the glass substrate through a projection optical system. With the increase in the areal size of the liquid crystal display panel, a scan type projection exposure apparatus has been proposed to enlarge an exposure area of the projection exposure apparatus.

Further, when a resist is coated on the glass substrate by use of a spin coater, it follows that a resist thickness in the vicinity of an edge is larger than in other portions. For this reason, in the case of a positive resist, even when the portion in the vicinity of the edge is exposed with an exposure quantity optimal to the pattern exposure, the resist in close proximity to the edge remains undeveloped, and this may cause generation of particles. Therefore, a dedicated peripheral exposure apparatus has been required.

However, with the increased areal size of the glass substrate, an increase in size of the dedicated peripheral exposure apparatus can not be avoided, resulting in a problem in that a larger space is needed.

Also, when using the peripheral exposure apparatus, there arises a problem in which the number of processes augments, so that throughput decreases.

SUMMARY OF THE INVENTION

Accordingly, it is a primary object of the present invention to provide a scan type exposure apparatus capable of preventing generation of particles due to a resist in the vicinity of an edge, without using a dedicated peripheral exposure apparatus.

According to one aspect of the present invention, there is provided a scan type exposure apparatus comprising: a mask stage for mounting a mask formed with an exposure pattern; a substrate stage for mounting a rectangular photosensitive substrate; a driving unit for moving the mask stage and the substrate stage in synchronism with each other parallel to one side of the rectangular photosensitive substrate; illumination optical systems for illuminating the mask with light beams; and projection optical systems for projecting the light beams passing through the exposure pattern of the mask on a central area (PA), excluding peripheral areas (EX), of the photosensitive substrate and projecting the light beams passing through part of the mask other than the exposure pattern on the peripheral areas (EX). In this scan type exposure apparatus, the illumination optical system is provided with an exposure quantity control unit for setting an exposure quantity for the peripheral areas (EX) larger than an exposure quantity for the central area (PA).

Further, plural pairs of the illumination optical systems and the projection optical systems are provided, and the exposure quantity control unit is provided in the illumination optical system for controlling exposing of the peripheral areas (EX) and the central area (PA) adjacent to the peripheral areas (EX).

Also, the exposure quantity control unit can be a light quantity control unit for controlling a light quantity for exposing the central area (PA).

According to the present invention, the illumination optical system incorporates the exposure quantity control unit. This exposure quantity control unit sets the exposure quantity for the peripheral areas (EX) larger than the exposure quantity for the central area (PA). For this reason, there increases the exposure quantity of the edge portion having a larger resist thickness than in other portions. All the resists of the edge portions can be developed in a developing process, and the generation of particles can be therefore prevented. This eliminates the dedicated peripheral exposure apparatus.

Further, an exposure areal size variable varying unit serving as the exposure quantity control unit can increase the exposure areal size of the peripheral areas, thereby causing an increment in the exposure quantity of the peripheral areas (EX).

Additionally, the light quantity control unit serving as the exposure quantity control unit can set the light quantity for exposing the central area (PA) smaller than the light quantity for exposing the peripheral areas (EX) and, besides, provide a light quantity sufficient to effect the pattern exposure.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

One embodiment of the present invention will hereinafter be discussed with reference to FIGS. 1 to 4.

Figure 1:
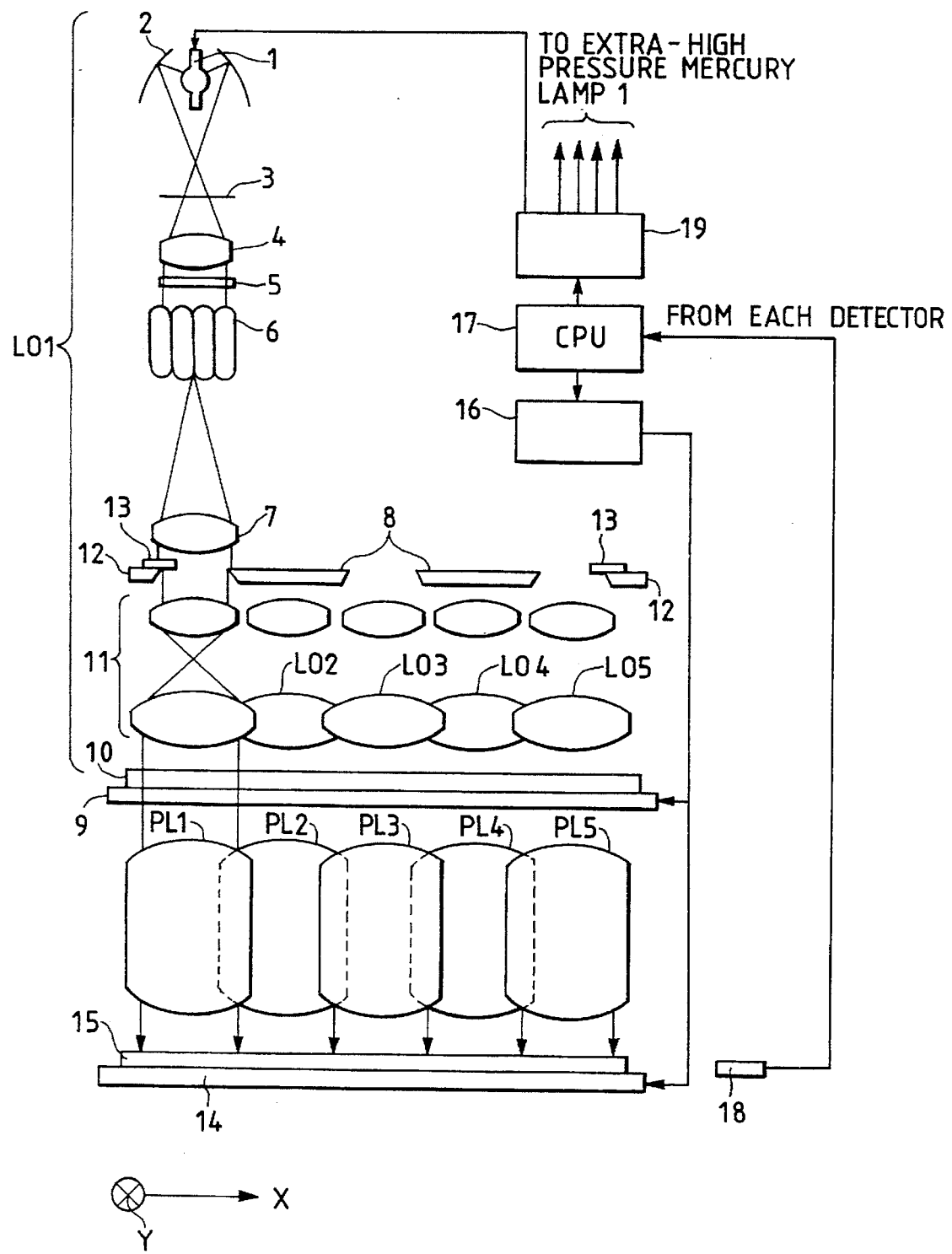
FIG. 1 is a view schematically illustrating a scan type exposure apparatus in one embodiment of the present invention.

FIG. 1 is a view schematically illustrating a construction of a scan type exposure apparatus according to the present invention. Referring to FIG. 1, in an illumination optical system LO1 light beams emitted from an extra-high pressure mercury lamp 1 are converged by an elliptical mirror 2. The thus converged light beams are incident on a lens 4 via a shutter 3.

The lens 4 collimates the light beams passing through the shutter 3 into substantially parallel light beams, and a wavelength selection filter 5 transmits only the light having a wavelength needed for an exposure. The light beams passing through the wavelength selection filter 5 are incident in the form of substantially parallel light beams upon a fly's eye integrator 6.

The fly's eye integrator 6 emits light beams uniformized in terms of an illumination distribution to a lens 7. The lens 7 collimates these light beams into substantially parallel light beams which are in turn incident upon a field stop 12.

The field stop 12, formed with a trapezoidal aperture, assuming regulates an illumination range on a mask 10 mounted on a mask stage 9 and having exposure patterns.

The light beams passing through the field stop 12 are projected to form an image of the aperture of the field stop via a lens system 11 on the mask 10.

Note that a system ranging from the above extra-high pressure mercury lamp 1 to the lens system 11 is hereinbelow termed an illumination optical system LO1.

In this embodiment, five illumination optical systems each having the same general configuration as that of this illumination optical system LO1 are arranged at fixed intervals in X- and Y-directions in FIG. 1. (However, in FIG. 1, for convenience, there is shown only one complete illumination optical system, including a lens system 11, and the other illumination optical systems are designated by LO2–LO5, respectively, which have field stops 8).

Different illumination areas on the mask 10 are illuminated with the light beams emitted from the respective illumination optical systems LO1–LO5.

Peripheral field stops 12 and movable light shield plates 13 are incorporated into the illumination optical systems LO1 and LO5 disposed at opposite ends of the series of illumination optical systems.

Figure 2:
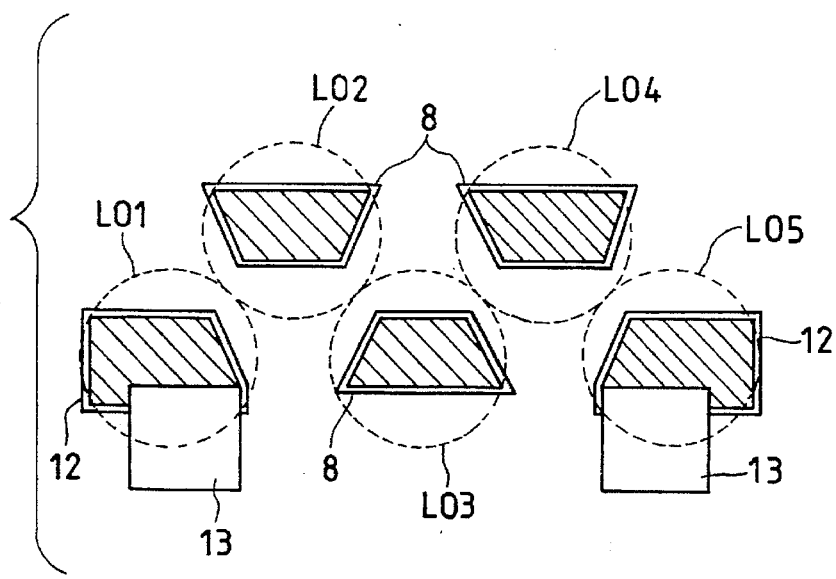
FIG. 2 is a view fully showing a field stop, a peripheral field stop and a movable light shield plate of FIG. 1.

FIG. 2 is a view illustrating details of the peripheral field stops 12 and the movable light shield plates 13 incorporated into the illumination optical systems LO1, LO5 as well as illustrating the field stops 8 provided in the illumination optical systems LO2–LO4.

Each field stop 8 is formed with trapezoidal aperture indicated by oblique lines.

Each peripheral field stop 12 has an aperture (shown by oblique lines). Each movable light shield plate 13 is moved by an unillustrated actuator and partially shields the aperture of a peripheral field stop 12.

Note that an exposure quantity control mechanism includes the peripheral field stops 12 and the movable light shield plates 13 in this embodiment.

Referring back to FIG. 1, five light beams penetrating the mask 10 are projected on different projection areas on a rectangular glass substrate 15 mounted on a substrate stage 14, via projection optical systems PL1–PL5 individually arranged corresponding to the illumination optical systems LO1–LO5.

Note that each of the projection optical systems PL1–PL5 is an equi-powered erect system in this embodiment.

Figure 3:
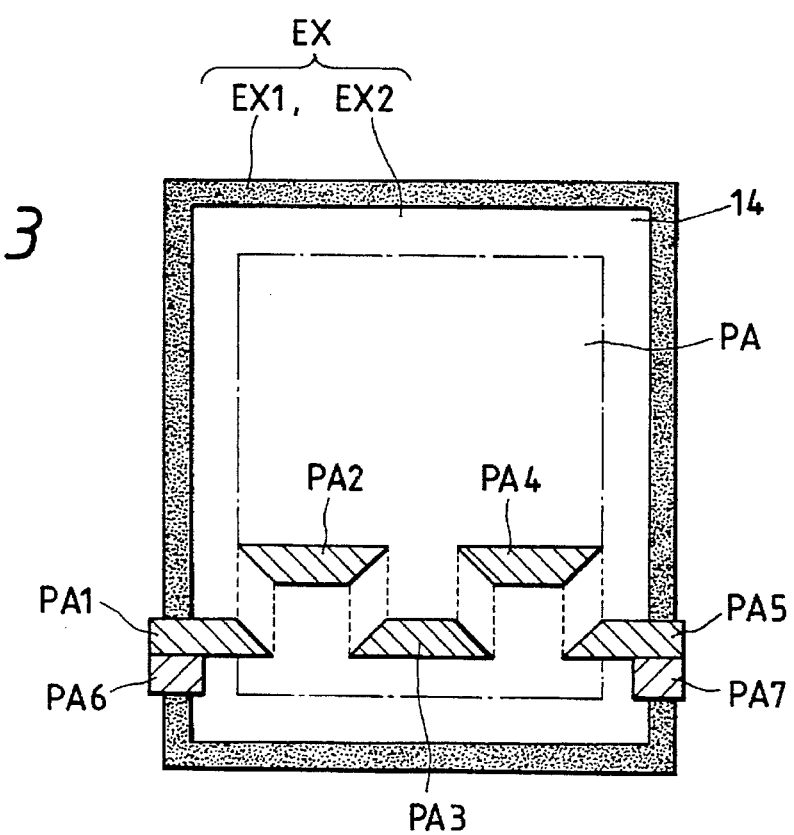
FIG. 3 is a view illustrating on-glass-substrate projection areas of a projection optical system.

FIG. 3 is a view illustrating the projection areas, on the glass substrate 15, of the projection optical systems PL1–PL5. Referring again to FIG. 3, the symbols PA1–PA5 designate exposure areas corresponding to the projection optical system PL1–PL5, respectively, and forming two parallel rows perpendicular to the Y-coordinate axis. Exposure areas PA6, PA7 are set by the peripheral field stops 12 and the movable light shield plates 13. The area PA defined by a one-dotted line is the exposure area on which the exposure pattern is exposed. Areas excluding the area PA on the glass substrate 15 are peripheral areas EX on which no pattern is exposed. A peripheral area EX1 has a larger resist thickness than in other areas when a resist is coated on the glass substrate 15 by use of a spin coater. An area EX2 is coated with the resist in the same thickness as that of the area PA.

The projection optical systems adjacent to each other (e.g., PL1 and PL2 or PL2 and PL3) project to exposure areas that are overlapped with each other as shown by dash lines in FIG. 3.

Turning back to FIG. 1, a stage drive unit 16, upon receiving an indication from a CPU 17 which will be mentioned later, causes the mask stage 9 and the substrate stage 14 to effect scanning in synchronism with each other along the Y-coordinate axis through unillustrated motors. Thus, all the patterns on the mask 10 are exposed on the Glass substrate 15. Note that the synchronization includes a case where the mask stage 9 and the substrate stage 14 move while being integrally held.

Detectors 18 are disposed within the same plane as the surface (exposure surface) of the glass substrate 15, corresponding to the projection optical systems PL1–PL5. The detectors 18 measure exposure quantities of the projection areas through the respective projection optical systems.

The CPU 17 performs a variety of arithmetic processes for the pattern exposure and, at the same time, controls the stage drive unit 16 and a light quantity control circuit 19 as well.

The light quantity control circuit 19 detects the exposure quantity of each projection area on the glass substrate 15 from an output of the detectors 18. The light quantity control circuit 19 controls luminance of the extra-high pressure mercury lamps 1 so as to adjust the exposure quantities of the individual projection areas.

The exposure operation of the thus constructed scan type exposure apparatus will hereinafter be explained with reference to FIG. 4 which is a flowchart of the CPU 17.

The CPU 17 at first recognizes the position and size of the exposure pattern area PA (step 101).

Next, the CPU 17 instructs the stage drive unit 16 to effect the exposure operation. That is, the stage drive circuit 16, as stated above, moves the mask stage 9 and the substrate stage 14 along the Y-coordinate axis in synchronism (step 102). Incidentally, in this embodiment, it is assumed that the substrate areas corresponding to the exposure areas PA2, PA4 are exposed in advance of the exposure areas PA1, PA3, PA5.

The CPU 17, because of exposing the peripheral area EX1 having the large resist thickness, increases a light quantity of the extra-high pressure mercury lamp 1 of each of the illumination optical systems LO1–LO5 larger than in the ordinary exposure, through the light quantity control circuit 19 (step 103).

With this processing, the peripheral area EX1 is scanned with the exposure areas PA2, PA4 and thus exposed, and subsequently the peripheral area EX2 is exposed. When the peripheral area EX2 is exposed after finishing the exposure on the peripheral area EX1, no exposure pattern is formed on the peripheral area EX2, and, hence, there is no problem if the light quantity remains large.

The CPU 17, in accordance with a start of the pattern exposure by the illumination optical systems LO2, LO4 (i.e., the exposure areas PA2, PA4), controls the extra-high pressure mercury lamps of the illumination optical systems LO2, LO4 through the light quantity control circuit 19, thus reducing the quantities of the light beams to those used in the pattern exposing process (step 104).

During this period, or after this period (depending on Y-directional lengths of the peripheral areas EX1, EX2 and Y-directional spacings between the exposure areas PA2, PA4 and the exposure areas PA1, PA3, PA5), the exposure areas PA1, PA3, PA5 pass through the peripheral area EX2 after finishing the exposure of the peripheral area EX1.

Next, the CPU 17, in accordance with a start of the pattern exposure by the illumination optical systems LO1, LO3, LO5 (i.e., the exposure areas PA1, PA3, PA5), controls the extra-high pressure mercury lamps 1 of the illumination optical systems LO1, LO3, LO5 through the light quantity control circuit 19, thus reducing the quantities of the light beams therefrom to those use in the pattern exposing process (step 105).

Further, the CPU 17 regulates an exposure areal size with the aid of the peripheral field stops 12 and the movable light shield plates 13 that serve as an exposure areal size varying mechanism (step 106). More specifically, the CPU 17 moves the movable light shield plates 13 through an unillustrated actuator, thereby partially shielding the apertures of the peripheral field stops 12. The movable light shield plates 13 are disposed in such positions that the exposure areas PA6, PA7 are formed in the peripheral areas EX1 provided at opposite edges extending parallel to the Y-direction and, ideally, in such positions that the exposure areas PA6, PA7 do not enter the range of the exposure pattern area PA. This arrangement provides a longer time to expose the peripheral areas EX1 provided at opposite edges extending in parallel to the Y-direction, and, consequently, the exposure quantity increases. It is therefore possible to expose these peripheral areas EX1 with the quantity of the light beams from the extra-high pressure mercury lamps 1 when performing the pattern exposure.

The CPU 17, in accordance with an end of the pattern exposure by the illumination optical systems LO2, LO4, controls the extra-high pressure mercury lamps 1 of the illumination optical systems LO2, LO4 through the light quantity control circuit 19, thus increasing the quantities of the light beams therefrom (step 107).

Subsequently, the CPU 17, in accordance with the end of the pattern exposure by the illumination optical systems LO1, LO3, LO5, controls the extra-high pressure mercury lamps 1 of the illumination optical systems LO1, LO3, LO5 through the light quantity control circuit 19, thus increasing the quantities of the light beams therefrom (step 108).

Thus, all the peripheral areas EX1 can be exposed with sufficient exposure quantity.

Next, an example of modification of this embodiment will be explained with reference to FIG. 5.

In the modified example thereof, the components other than the movable light shield plates 13 are the same as those in FIG. 1 and marked with the like symbols, but their explanations will be omitted. Further, the peripheral field stops 12 have an aperture smaller than the one shown in FIG. 2.

Figure 5:
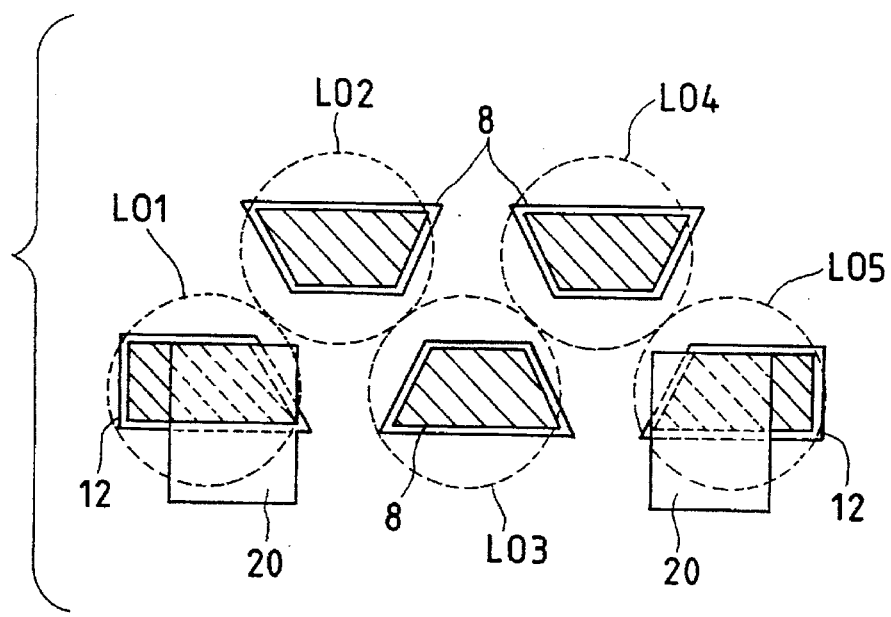
FIG. 5 is a view illustrating a movable ND filter.

FIG. 5 is a view illustrating ND filters 20 each serving as a light quantity regulating mechanism disposed in place of the movable light shield plates 13 in this embodiment. The ND filters are movable by an unillustrated actuator and partially shield the apertures (indicated by the oblique lines) of the peripheral field stops 12. Thus, the quantity of the light beams passing through the apertures of the peripheral field stops 12 is partially reduced.

The discussion on the exposing operation in this modified example will hereinbelow continue with reference to FIG. 6 which is a flowchart of the CPU 17.

Figure 4:
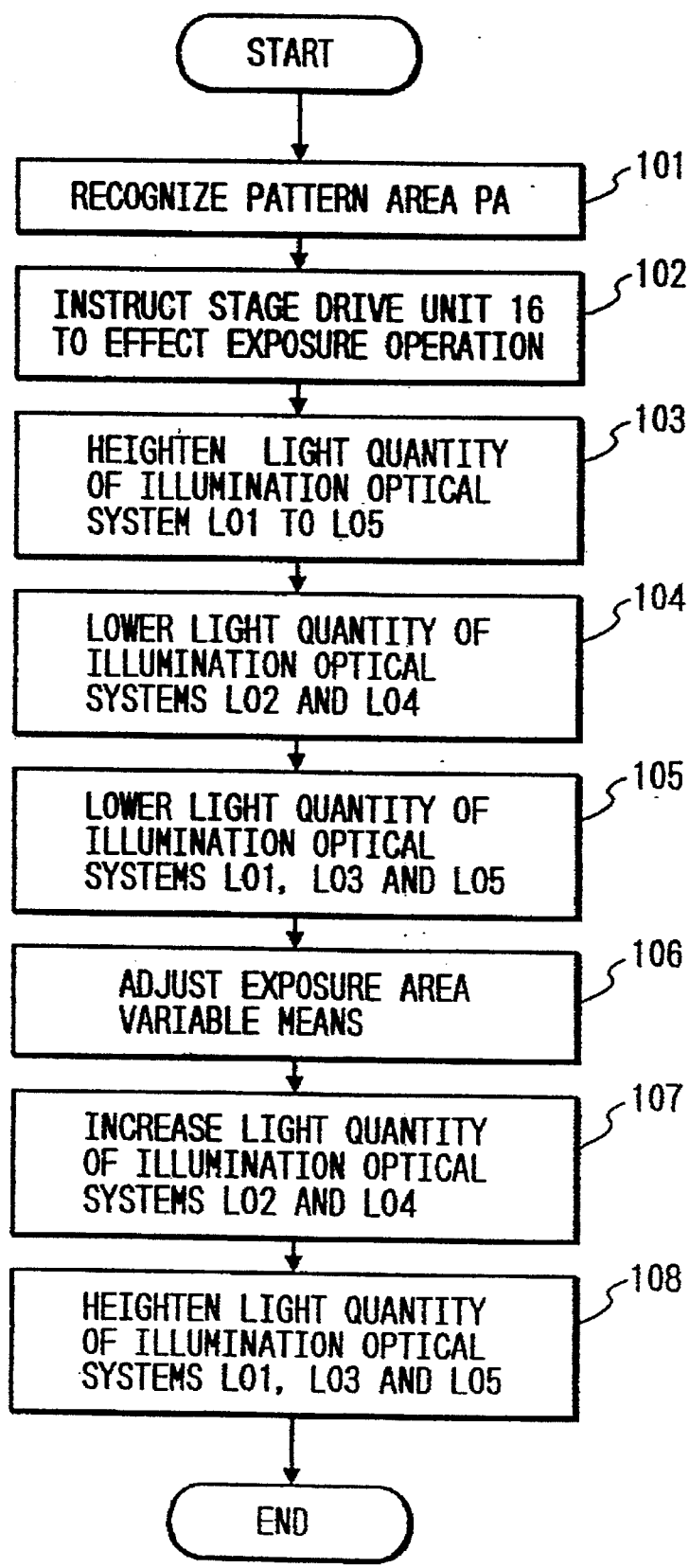
FIG. 4 is a flowchart of a CPU in the embodiment.
Figure 6:
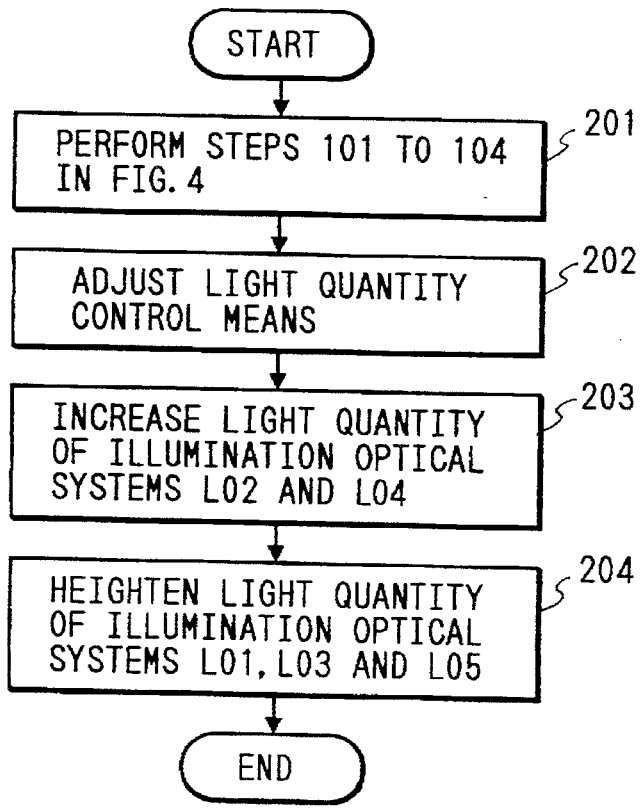
FIG. 6 is a flowchart of the CPU in a modified example.

Note that the processes from steps 101–104 in the flowchart of FIG. 4 are the same as those of the exposing operation in the modified example and are therefore included in step 201 of the flowchart of FIG. 6 with an omission of their explanations.

The CPU 17, in accordance with a start of the exposure on the pattern area PA through the exposure areas PA1, PA3, PA5 after starting the exposure of the pattern area PA through the exposure areas PA2, PA4, controls the light quantities of the exposure areas PA1, PA5 in the following manner with the aid of the peripheral field stops 12 and the movable ND filters 20 that serve as a light quantity control mechanism (step 202). Note that the light quantity for the exposure area PA3 is set smaller than the light quantity when exposing the peripheral area EX.

That is, the movable ND filters 20 are moved to enter the apertures of the peripheral field stops 12 through the unillustrated actuator. Then, the ND filters 20 are adjusted in such a position as to reduce the light quantity with respect to only the portion to expose the pattern area PA. With this adjustment, it is possible to equalize the exposure quantity of the exposure area PA which depends on the exposure area light-reduced by the ND filters 20 to those of the exposure areas PA2–PA4 through other illumination optical systems.

The CPU 17, in accordance with an end of the pattern exposure by the illumination optical systems LO2, LO4, controls the extra-high pressure mercury lamps 1 of the illumination optical systems LO2, LO4 through the light quantity control circuit 19, thus increasing the quantities of the light beams therefrom to expose the peripheral area EX (step 203).

The CPU 17, in accordance with an end of the pattern exposure by the illumination optical systems LO1, LO3, LO5, controls the extra-high pressure mercury lamp 1 of the illumination optical system LO3 through the light quantity control circuit 19 to increase the quantity of the light beam therefrom. The CPU 17, at the same time, causes the peripheral area EX to be exposed by retracting the ND filters 20 from the field stops 12 (step 204).

Thus, all of the EX1 area can be exposed with sufficient exposure quantity.

In accordance with these embodiments, although the peripheral field stops 12 and the movable light shield plates 13 or the ND filters 20 are disposed in the illumination optical systems LO1, LO5, the present invention is not confined to this arrangement. For example, when both of the peripheral area EX1 and the exposure area PA have to be simultaneously exposed through the exposure area PA2 of the illumination optical system LO2, a movable light shield plate 13 or ND filter 20 may be disposed in the illumination optical system LO2.

Further, in these embodiments, the quantity of the light beams is regulated by controlling the extra-high pressure mercury lamps 1, but the pattern exposure and the peripheral area exposure may be separately performed by providing two sets of light sources.

It is apparent that, in this invention, a wide range of different working modes can be formed based on the invention without deviating from the spirit and scope of the invention. This invention is not restricted by its specific working modes except being limited by the appended claims.

What is claimed is:

1. A scan type exposure apparatus, comprising:
    a driving system for moving a mask having an exposure pattern and a photosensitive substrate in synchronism along a predetermined coordinate axis;

a plurality of illumination optical systems for illuminating, respectively, a plurality of partial areas of said mask;

a plurality of projection optical systems for projecting respective images of the illuminated plurality of partial areas onto corresponding portions of an exposure area of said photosensitive substrate; and an exposure light amount adjusting device for, in a light path for illuminating a partial area of said mask at least at one side of said of said plurality of partial areas, adjusting an amount of illumination of said exposure pattern and an amount of illumination of a portion of said mask excluding said exposure pattern.

2. A scan type exposure apparatus according to claim 1, wherein said exposure light amount adjusting device is disposed in an illumination optical system located at least at one side of said plurality of illumination optical systems at a position substantially conjugate with said photosensitive substrate.

3. A scan type exposure apparatus according to claim 1, wherein said exposure light amount adjusting device is disposed in a projection optical system located at least at one side of said plurality of projection optical systems at a position substantially conjugate with said photosensitive substrate.

4. A scan type exposure apparatus according to claim 1, wherein said exposure area of said photosensitive substrate comprises a pattern exposure area portion to which a pattern image of said mask is projected and a peripheral exposure area portion surrounding said pattern exposure area portion, and said apparatus substantially simultaneously exposes a part of said pattern exposure area portion and a part of said peripheral exposure area portion.

5. A scan type exposure apparatus according to claim 1, wherein said exposure area portions comprise a first group located in a first row extending transverse to said coordinate axis and a second group located in a second row substantially in parallel with said first row.

6. A scan type exposure apparatus according to claim 1, wherein said exposure area of said photosensitive substrate comprises a pattern exposure area to which a pattern image of said mask is projected and a peripheral exposure area adjacent to said pattern exposure area, wherein said at least one exposure area portion has a part in said peripheral exposure area and has a part in said pattern exposure area, and wherein said exposure light amount adjusting device sets different exposure light amounts for said at least one exposure area portion by adjusting the relative sizes of said parts.

7. A scan type exposure apparatus according to claim 6, wherein:

said exposure light amount adjusting device comprises a light shield member for blocking part of a light beam projected toward said at least one exposure area portion.

8. A scan exposure apparatus according to claim 7, wherein said driving system moves said mask and said photosensitive substrate in synchronism in a predetermined first direction, and said light shield member blocks said part of a light beam by moving in said first direction.

9. A scan type exposure apparatus according to claim 1, wherein said exposure light amount adjusting device adjusts an amount of light projected to a pattern exposure area portion of said exposure area.

10. A scan type exposure apparatus according to claim 1, wherein said exposure light amount adjusting device includes an ND filter.

11. A scan type exposure apparatus, comprising:

a driving device for moving a mask having an exposure pattern and a photosensitive substrate of rectangular shape in synchronism along a predetermined coordinate axis; and an exposure control device for, by a single operation of said driving device, performing exposure of said exposure pattern to a pattern exposure portion of an exposure area of said photosensitive substrate, exposure of a first peripheral portion of said exposure area substantially in parallel with said coordinate axis and exposure of a second peripheral portion of said exposure area substantially orthogonal to said first coordinate axis; wherein:

said exposure control device includes a plurality of illumination optical systems for illuminating a plurality of partial areas of said mask and a plurality of projection optical systems for projecting images of respective partial areas onto said photosensitive substrate, and said exposure control device sets a plurality of exposure light amounts in a light beam corresponding to a partial area at least at one side of said plurality of partial areas.

12. A scan type exposure apparatus, comprising:

a driving device for moving a mask having an exposure pattern and a photosensitive substrate of rectangular shape in synchronism along a predetermined coordinate axis; and an exposure control device for, by a single operation of said driving device, performing exposure of said exposure pattern to a pattern exposure portion of an exposure area of said photosensitive substrate, exposure of a first peripheral portion of said exposure area substantially in parallel with said coordinate axis, and exposure of a second peripheral portion of said exposure area substantially orthogonal to said coordinate axis, wherein said first peripheral portion and said second peripheral portion are outside of said pattern exposure portion of said exposure area.

13. A scan type exposure apparatus according to claim 12, wherein an exposure light amount to said pattern exposure portion of said exposure area is different from an exposure light amount to said first peripheral portion.

14. A scan type exposure apparatus according to claim 12, wherein an exposure light amount to said pattern exposure portion of said exposure area is smaller than an exposure light amount to said second peripheral portion.

15. A method for exposing a photosensitive substrate in which exposure is performed by transmitting a plurality of light beams through a plurality of partial areas, respectively, of a mask having an exposure pattern, to corresponding portions of an exposure area of a photosensitive substrate, said method comprising:

moving said mask and said photosensitive substrate in synchronism along a predetermined coordinate axis; and in the course of said moving, performing exposure to exposure pattern portions of said exposure area of said photosensitive substrate, exposure to a first peripheral portion of said exposure area that is substantially parallel to said coordinate axis, and exposure to a second peripheral portion of said exposure area that is substantially orthogonal to said coordinate axis.

16. A method according to claim 15, wherein an exposure light amount to said exposure pattern portions is made different from an exposure light amount to said first peripheral portion.

17. A method according to claim 15, wherein an exposure light amount to said exposure pattern portions is made smaller than an exposure light amount to said second peripheral portion.

18. A method according to claim 15, wherein said second peripheral portion includes a first part to which exposure is performed previous to the exposure to said exposure pattern portions and a second part to which exposure is performed after exposure to said exposure pattern portions.

19. A method according to claim 15, further comprising reducing an exposure light amount after said second peripheral portion is exposed.

20. A method according to claim 19, further comprising increasing the exposure light amount after said exposure pattern portions are exposed.

* * * * *